United States Patent
Cho et al.

(10) Patent No.: US 11,190,188 B2
(45) Date of Patent: Nov. 30, 2021

(54) MEMORY INTERFACE CIRCUIT INCLUDING OUTPUT IMPEDANCE MONITOR AND METHOD OF CALIBRATING OUTPUT IMPEDANCE THEREOF

(71) Applicant: Electronics and Telecommunications Research Institute, Daejeon (KR)

(72) Inventors: Min-Hyung Cho, Daejeon (KR); Young-deuk Jeon, Sejong-si (KR); Seong Min Kim, Sejong-si (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 16/996,389

(22) Filed: Aug. 18, 2020

(65) Prior Publication Data

US 2021/0184677 A1   Jun. 17, 2021

(30) Foreign Application Priority Data

Dec. 12, 2019   (KR) .................. 10-2019-0166100
Jul. 29, 2020    (KR) .................. 10-2020-0094366

(51) Int. Cl.
*H03K 19/017*   (2006.01)
*H03K 19/08*    (2006.01)
(Continued)

(52) U.S. Cl.
CPC ... *H03K 19/01742* (2013.01); *H03K 19/0813* (2013.01); *H03K 19/096* (2013.01); *H03K 19/17784* (2013.01)

(58) Field of Classification Search
CPC ......... H03K 19/01742; H03K 19/0813; H03K 19/096; H03K 19/17784; H03K 19/005;
(Continued)

(56) References Cited

U.S. PATENT DOCUMENTS 5,134,311 A * 7/1992 Biber ................. H03K 19/0005
                                                                326/30
6,351,172 B1* 2/2002 Ouyang ........... H03K 19/00384
                                                                327/112
(Continued)

FOREIGN PATENT DOCUMENTS

KR   10-2015-0073336   7/2015
KR   10-2019-0099933   8/2019

OTHER PUBLICATIONS

Keunsoo Song et al., "A 1.1 V 2y-nm 4.35 GB/s/pin 8 GB LPDDR4 Mobile Device With Bandwidth Improvement Techniques", IEEE Journal of Solid-State Circuits, Aug. 2015, pp. 1945-1959, vol. 50, No. 8.

*Primary Examiner* — Seokjin Kim
(74) *Attorney, Agent, or Firm* — Kile Park Reed & Houtteman PLLC

(57) ABSTRACT

Disclosed are a memory interface circuit including an output impedance monitor, which is capable of monitoring and calibrating an output impedance of a driving circuit in real time, and a method of calibrating the output impedance. The memory interface circuit includes a control circuit that outputs a digital transmission signal, a driving circuit that outputs an output signal, based on the digital transmission signal, an output impedance monitor that outputs a pull-up monitoring signal or a pull-down monitoring signal, based on the digital transmission signal and the output signal, and an output impedance calibrator that outputs an impedance monitoring signal, based on the pull-up monitoring signal or
(Continued)

the pull-down monitoring signal, and wherein the driving circuit calibrates output impedance based on the impedance monitoring signal.

16 Claims, 10 Drawing Sheets

(51) Int. Cl.
*H03K 19/096* (2006.01)
*H03K 19/17784* (2020.01)

(58) Field of Classification Search
CPC ............ H03K 19/01745; G11C 7/1057; G11C 2207/2254
See application file for complete search history.

(56) References Cited

U.S. PATENT DOCUMENTS

| | | |
|---|---|---|
| 7,940,078 B2 | 5/2011 | Pan |
| 8,334,706 B2 | 12/2012 | Moon |
| 9,767,921 B1 | 9/2017 | Pan |
| 10,643,675 B2 | 5/2020 | Heo et al. |
| 2014/0372669 A1 | 12/2014 | Kwon et al. |
| 2018/0091148 A1* | 3/2018 | Mohd Yusof ...... H03K 19/0005 |

* cited by examiner

MEMORY INTERFACE CIRCUIT INCLUDING OUTPUT IMPEDANCE MONITOR AND METHOD OF CALIBRATING OUTPUT IMPEDANCE THEREOF

CROSS-REFERENCE TO RELATED APPLICATIONS

This application claims priority under 35 U.S.C. § 119 to Korean Patent Application Nos. 10-2019-0166100 filed on Dec. 12, 2019, and 10-2020-0094366 filed on Jul. 29, 2020, respectively, in the Korean Intellectual Property Office, the disclosures of which are incorporated by reference herein in their entireties.

BACKGROUND

Embodiments of the inventive concept described herein relate to a calibration of an output impedance of a memory interface circuit, and more particularly, relate to a memory interface circuit capable of monitoring and calibrating the output impedance of a driving circuit in real time and a method of calibrating the output impedance thereof.

Memory devices typified by a DRAM are widely used in almost all electronic devices that perform operations, such as PCs, notebooks, servers, smartphones, etc. To improve performance of the electronic devices such as the PCs, it is necessary to increase a data transfer speed of a memory as well as an operation speed of a processor. In particular, as the computational demand increases in the process of processing big data using machine learning, the demand for a memory having a larger capacity and a faster data transfer rate is also increasing.

An output impedance of a memory interface driving circuit changes depending on a change in device characteristics occurred in a process of manufacturing a semiconductor chip, a change in a voltage condition applied to each device in a circuit, and a change in a circuit ambient temperature. When the output impedance and an impedance of a receiving end do not match to each other, a signal reflected from the receiving end is not properly transmitted, and a voltage level at the receiving end is changed. Therefore, since data transmission of the memory may not be properly performed, a process of calibrating (ZQ calibration) the output impedance of the memory interface output driving circuit is essential.

Conventional output impedance calibration is generally performed in an initialization process, after power is supplied to the memory interface and before data transmission and reception is performed, or is performed when a change in the surrounding environment such as temperature occurs during a memory interface operation. As described above, when data transmission is stopped during the memory interface operation, and data transmission is newly started after output impedance calibration is performed, since the data transmission cannot be performed as much as the time required for the calibration, the actual data transmission efficiency per unit time decreases. Accordingly, there is a need for a method for improving the actual data transmission efficiency by decreasing the time required for the output impedance calibration performed during the memory interface operation.

SUMMARY

Embodiments of the inventive concept provide a memory interface circuit including an output impedance monitor, which is capable of calibrating an output impedance without interrupting data transmission of a driving circuit, and a method of calibrating the output impedance thereof.

According to an exemplary embodiment of the inventive concept, a memory interface circuit includes a control circuit that outputs a digital transmission signal, a driving circuit that outputs an output signal, based on the digital transmission signal, an output impedance monitor that outputs a pull-up monitoring signal or a pull-down monitoring signal, based on the digital transmission signal and the output signal, and an output impedance calibrator that outputs an impedance monitoring signal, based on the pull-up monitoring signal or the pull-down monitoring signal, and wherein the driving circuit calibrates output impedance based on the impedance monitoring signal.

According to an exemplary embodiment of the inventive concept, a method of calibrating an output impedance of a memory interface circuit includes outputting, by a control circuit, a digital transmission signal, outputting, by a driving circuit, an output signal based on the digital transmission signal, outputting, by a pull-up monitor or a pull-down monitor of an output impedance monitor, a monitoring signal based on the digital transmission signal and the output signal, outputting, by an output impedance calibrator, an impedance monitoring signal based on the monitoring signal, and calibrating, by the driving circuit, an output impedance based on the impedance monitoring signal.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
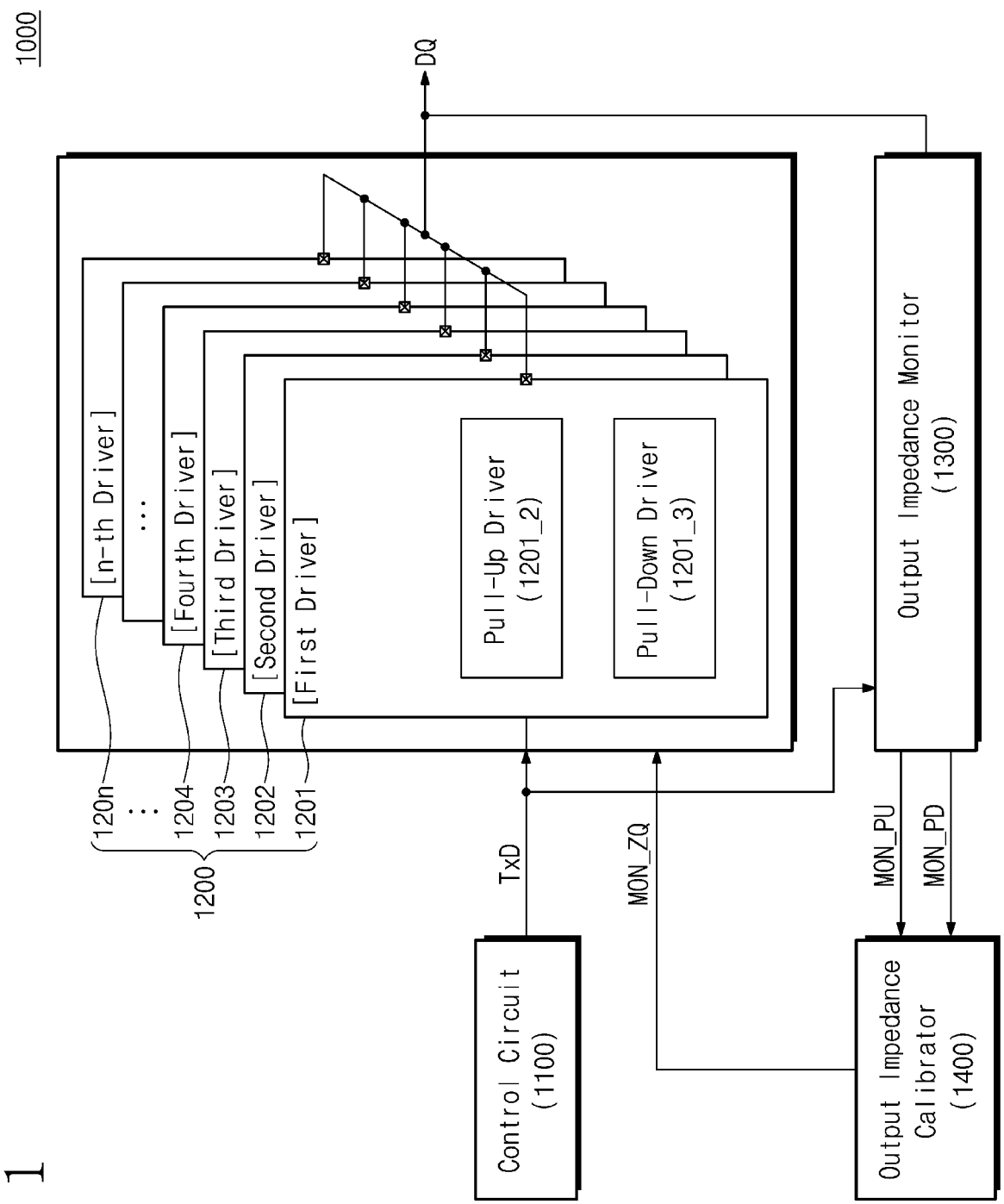
FIG. 1 is a circuit diagram illustrating a configuration of a memory interface circuit according to an embodiment of the inventive concept.

Hereinafter, embodiments of the inventive concept will be described clearly and in detail such that those skilled in the art may easily carry out the inventive concept.

Components described with reference to terms such as parts or units, modules, blocks, and ~er or ~or, which are used in the detailed description and functional blocks illustrated in the drawings may be implemented in the form of software, hardware, or a combination of hardware and software. Illustratively, the software may be machine code, firmware, embedded code, or application software. For example, the hardware may include electrical circuits, electronic circuits, processors, computers, integrated circuits, integrated circuit cores, pressure sensors, inertial sensors, microelectromechanical systems (MEMS), passive elements, or combinations thereof.

FIG. 1 is a circuit diagram illustrating a configuration of a memory interface circuit 1000 according to an embodiment of the inventive concept.

The memory interface circuit 1000 may include a control circuit 1100, a driving circuit 1200, an output impedance monitor 1300, and an output impedance calibrator 1400. The control circuit 1100 may output a digital transmission signal TxD that controls the driving circuit 1200 and the output impedance monitor 1300. For example, the digital transmission signal TxD may include logic high and logic low.

The driving circuit 1200 may include a plurality of drivers 1201 to 120n. The driving circuit 1200 may receive the digital transmission signal TxD from the control circuit 1100, and may output an output signal DQ corresponding to the digital transmission signal TxD. For example, the driving circuit 1200 may include a pull-up driver and a pull-down driver. For example, the pull-up driver may include at least one PMOS transistor, and the pull-down driver may include at least one NMOS transistor.

The output impedance monitor 1300 may receive the digital transmission signal TxD from the control circuit 1100. The output impedance monitor 1300 may receive the output signal DQ from the driving circuit 1200. The output impedance monitor 1300 may output a pull-up monitoring signal MON_PU and a pull-down monitoring signal MON_PD to the output impedance calibrator 1400, based on the digital transmission signal TxD and the output signal DQ. For example, the output impedance monitor 1300 may output a signal that detects whether a change in output impedance of the pull-up driver or the pull-down driver constituting the driving circuit 1200 occurs, based on a value of the output signal DQ corresponding to the digital transmission signal TxD.

The output impedance calibrator 1400 may receive the pull-up monitoring signal MON_PU and the pull-down monitoring signal MON_PD from the output impedance monitor 1300, and may output an impedance monitoring signal MON_ZQ corresponding to the pull-up monitoring signal MON_PU and the pull-down monitoring signal MON_PD. For example, the impedance monitoring signal MON_ZQ may be a signal that controls to calibrate the output impedance of the pull-up driver or the pull-down driver constituting the driving circuit 1200, based on the change in the output impedance in the output impedance monitor 1300.

As described above, when the output impedance monitor 1300 detects whether the change in the output impedance of the driving circuit 1200 occurs, by outputting a signal that controls the output impedance calibrator 1400 to calibrate the output impedance of the driving circuit 1200, the change in output impedance may be detected and calibrated in real time without interrupting data transmission and reception in the driving circuit 1200.

Figure 2:
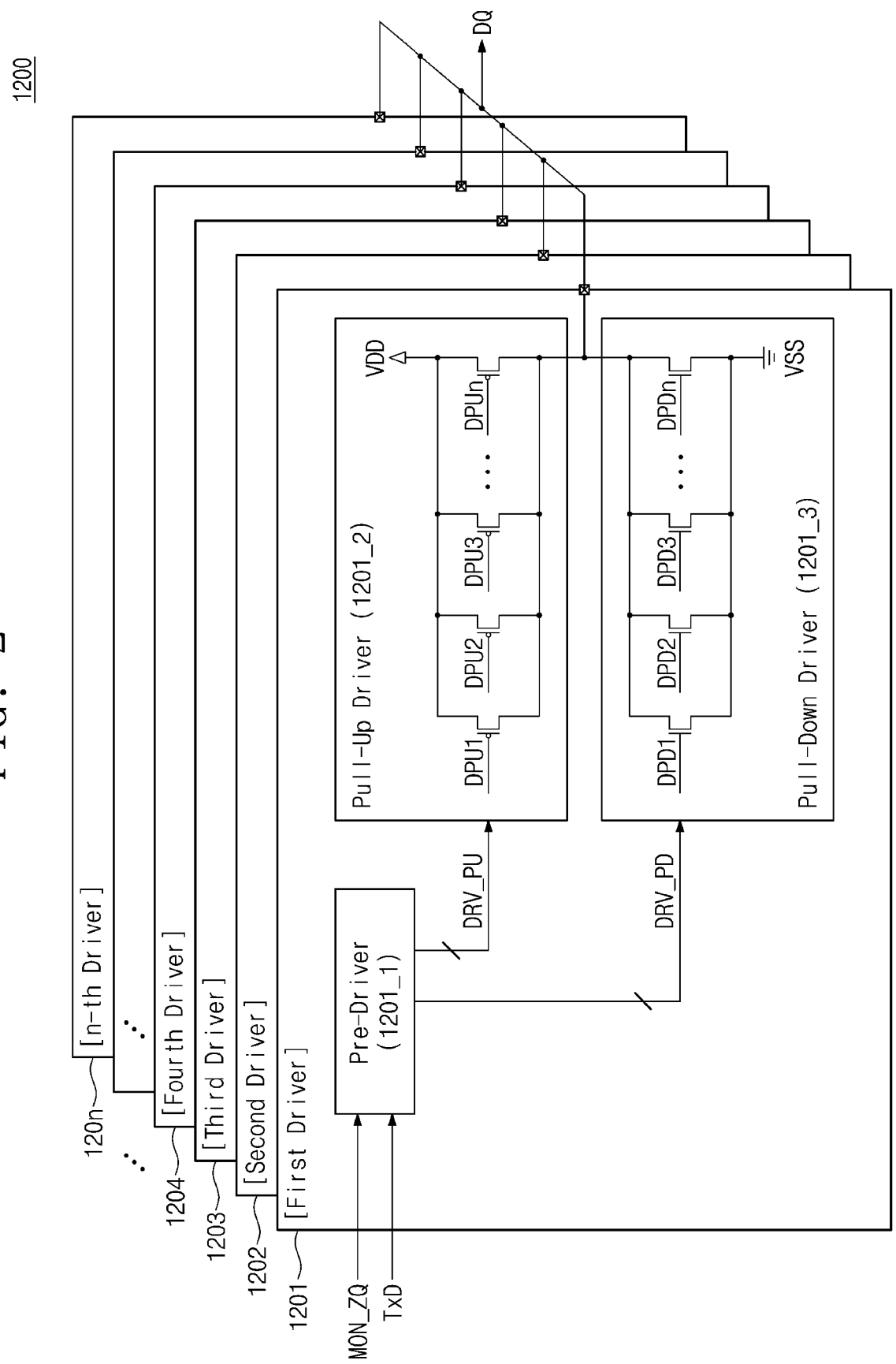
FIG. 2 is a circuit diagram illustrating a configuration of a driving circuit illustrated in FIG. 1.

FIG. 2 is a circuit diagram illustrating a configuration of a driving circuit 1200 illustrated in FIG. 1.

The driving circuit 1200 may include a plurality of drivers 1201 to 120n connected in parallel. Each of the plurality of drivers 1201 to 120n may have the same output impedance with one another. Each of the plurality of drivers 1201 to 120n may be selectively activated, and the output impedance of the driving circuit 1200 may be adjusted depending on the number of drivers being activated or the number of transistors constituting each driver. A level of the output signal DQ of the driving circuit 1200 may be determined based on the output impedance of the driving circuit 1200. Hereinafter, a configuration of the first driver 1201 will be described, and the configuration and operation of the plurality of drivers 1201 to 120n may be all the same.

The first driver 1201 may include a pre-driver 1201_1, a pull-up driver 1201_2, and a pull-down driver 1201_3. The pre-driver 1201_1 may output a pull-up driving signal DRV_PU capable of activating the pull-up driver 1201_2 or a pull-down driving signal DRV_PD capable of activating the pull-down driver 1201_3, based on the digital transmission signal TxD provided into the driving circuit 1200.

For example, the pre-driver 1201_1 may include logic gates (e.g., AND, OR, NOT, XOR, XNOR), but the inventive concept is not limited thereto. For example, when the digital transmission signal TxD is a logic high signal, the pre-driver 1201_1 may output the pull-up driving signal DRV_PU to the pull-up driver 1201_2. For example, when the digital transmission signal TxD is a logic low signal, the pre-driver 1201_1 may output the pull-down driving signal DRV_PD to the pull-down driver 1201_3. The pre-driver 1201_1 may receive the impedance monitoring signal MON_ZQ from the output impedance calibrator (1400 of FIG. 1), and may output the pull-up driving signal DRV_PU or the pull-down driving signal DRV_PD corresponding to the impedance monitoring signal MON_ZQ.

The pull-up driver 1201_2 may be activated by receiving the pull-up driving signal DRV_PU from the pre-driver 1201_1. The pull-down driver 1201_3 may be activated by receiving the pull-down driving signal DRV_PD from the pre-driver 1201_1. When the pull-up driver 1201_2 is activated, the output signal DQ may be a high voltage signal indicating logic high. When the pull-down driver 1201_3 is activated, the output signal DQ may be a low voltage signal indicating logic low. A waveform of the output signal DQ according to the change in output impedance will be described through FIG. 4A.

The pull-up driver 1201_2 may include a plurality of sub pull-up drivers DPU1 to DPUn connected in parallel. For example, each of the plurality of sub pull-up drivers DPU1 to DPUn may include a PMOS transistor or an NMOS transistor. Hereinafter, a case in which each of the plurality of sub pull-up drivers DPU1 to DPUn includes the PMOS transistor will be described, and the inventive concept is not limited thereto. The pull-down driver 1201_3 may include a plurality of sub pull-down drivers DPD1 to DPDn connected in parallel. For example, each of the plurality of sub pull-down drivers DPD1 to DPDn may include the NMOS transistor. Each of the plurality of sub pull-up drivers DPU1 to DPUn or the plurality of sub pull-down drivers DPD1 to DPDn may be selectively activated.

In detail, PMOS transistors constituting the plurality of sub pull-up drivers DPU1 to DPUn and NMOS transistors constituting the plurality of sub pull-down drivers DPD1 to DPDn may be selectively turned on or turned off. The output impedance of the pull-up driver 1201_2 or the pull-down driver 1201_3 may be adjusted based on the number of sub pull-up drivers or the number of sub pull-down drivers, which are activated. The number of sub pull-up drivers activated may be determined based on the pull-up driving signal DRV_PU received from the pre-driver 1201_1. The number of sub pull-down drivers activated may be determined based on the pull-down driving signal DRV_PD received from the pre-driver 1201_1. The pull-up driving signal DRV_PU may include a plurality of signals for individually controlling the plurality of sub pull-up drivers DPU1 to DPUn. The pull-down driving signal DRV_PD may include a plurality of signals for individually controlling the plurality of sub pull-down drivers DPD1 to DPDn.

Figure 3:
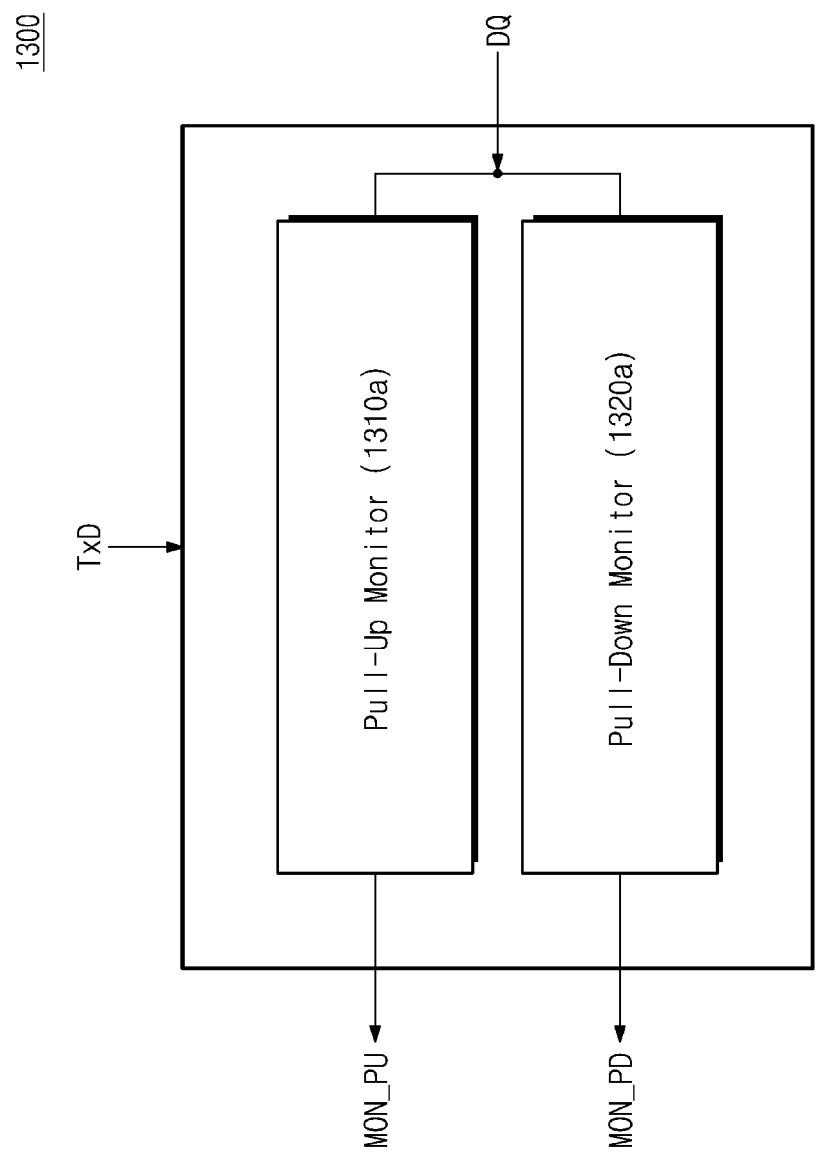
FIG. 3 is a block diagram illustrating a configuration of an output impedance monitor illustrated in FIG. 1.

FIG. 3 is a block diagram illustrating a configuration of the output impedance monitor 1300 illustrated in FIG. 1.

The output impedance monitor 1300 may include a pull-up monitor 1310a and a pull-down monitor 1320a. The output impedance monitor 1300 may receive the digital transmission signal TxD from the control circuit 1100. For example, when the input digital transmission signal TxD is the logic high signal, the pull-up monitor 1310a may be activated. For example, when the input digital transmission signal TxD is the logic low signal, the pull-down monitor 1320a may be activated. The output impedance monitor 1300 may receive the output signal DQ from the driving circuit (1200 of FIG. 1).

The pull-up monitor 1310a may detect the level of the output signal DQ out of an allowable range according to the change in the output impedance of the pull-up driver (1201_2 of FIG. 2), and may correspondingly generate a monitoring signal that detects the change in the output impedance the pull-up driver (1201_2 of FIG. 2). The pull-down monitor 1320a may detect the level of the output signal DQ out of the allowable range according to the change in the output impedance of the pull-down driver (1201_3 of FIG. 2), and may correspondingly generate a monitoring signal that detects the change in the output impedance the pull-down driver (1201_3 of FIG. 2).

Figure 4A:
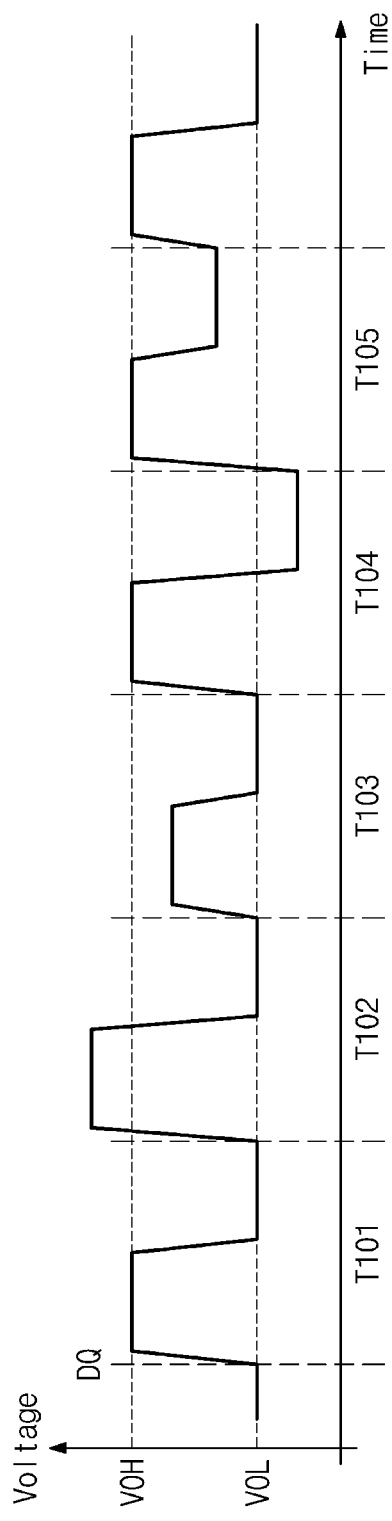
FIG. 4A is a diagram illustrating a waveform of an output signal according to a change in an output impedance of a driving circuit.

FIG. 4A is a diagram illustrating a waveform of the output signal DQ according to a change in an output impedance of the driving circuit 1200 according to an embodiment of the inventive concept. As described with reference to FIG. 2, VOH is the high voltage signal indicating logic high, and VOL is the low voltage signal indicating logic low. Hereinafter, the waveform of the output signal DQ will be described as being divided into first to fifth sections T101 to T105 over time.

Referring to FIG. 2 with FIG. 4A, The first section T101 represents a section in which the level of the output signal DQ is equal to the high voltage signal (DQ=VOH) or the level of the output signal DQ is equal to the low voltage signal (DQ=VOL), since no change occurs in the output impedance of the driving circuit 1200.

The second section T102 represents a section (DQ>VOH) in which the level of the output signal DQ is greater than the high voltage signal since the change in which the output impedance of the pull-up driver 1201_2 decreases occurs. The third section T103 represents a section (DQ<VOH) in which the level of the output signal DQ is less than the high voltage signal since the change in which the output impedance of the pull-up driver 1201_2 increases occurs.

The fourth section T104 represents a section (DQ<VOL) in which the level of the output signal DQ is less than the low voltage signal since the change in which the output impedance of the pull-down driver 1201_3 decreases occurs.

The fifth section T105 represents a section (DQ>VOL) in which the level of the output signal DQ is greater than the low voltage signal since the change in which the output impedance of the pull-down driver 1201_3 increases occurs.

Figure 4B:
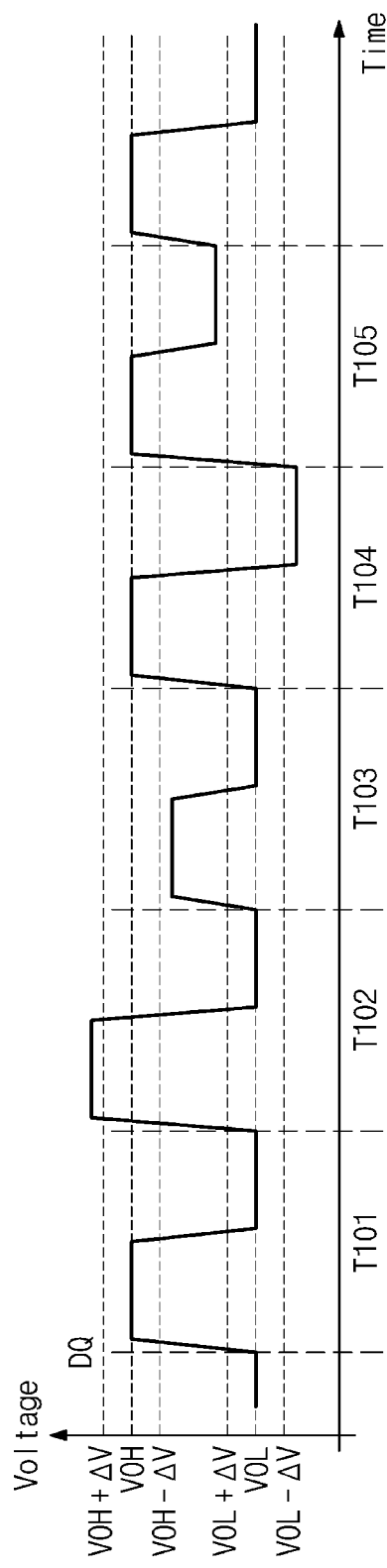
FIG. 4B is a diagram illustrating a method of determining an occurrence of an output impedance change in an output impedance monitor, based on a waveform of an output signal illustrated in FIG. 4A.

FIG. 4B illustrates a method of determining an occurrence of an output impedance change in the output impedance monitor 1300, based on a waveform of the output signal DQ illustrated in FIG. 4A.

Hereinafter, FIG. 4B will be described with reference to FIGS. 2 and 3 together. When a difference between the level of the output signal DQ when outputting logic high and the high voltage signal VOH is greater than the allowable range value±$\Delta$V, or when a difference between the level of the output signal DQ when outputting logic low and the low voltage signal VOL is greater than the allowable range value ±$\Delta$V, the output impedance monitor 1300 may determine that the change in the output impedance occurs in the driving circuit 1200. When it is determined by the output impedance monitor 1300 that the change in the output impedance occurs in the driving circuit 1200, the pull-up monitor 1310a or the pull-down monitor 1320a may output the pull-up monitoring signal MON_PU or the full-down monitoring signal MON_PD.

In the case of the first section T101, since the level of the output signal DQ is equal to the high voltage signal (DQ=VOH) or the level of the output signal DQ is equal to the low voltage signal (DQ=VOL), it may be determined that the change in the output impedance is not occurred by the output impedance monitor 1300.

In the case of the second section T102 or the third section T103, since the difference between the level of the output signal DQ when outputting logic high and the high voltage signal VOH is greater than the allowable range value ±$\Delta$V (DQ>VOH+$\Delta$V or DQ<VOH−$\Delta$V), it may be determined that the change in the output impedance change of the pull-up driver 1201_2 is occurred by the output impedance monitor 1300.

In the case of the fourth section T104 or the fifth section T105, since the difference between the level of the output signal DQ when outputting logic low and the low voltage signal VOL is greater than the allowable range value ±$\Delta$V (DQ<VOL−$\Delta$V or DQ>VOL+$\Delta$V), it may be determined that the change in the output impedance of the pull-down driver 1201_3 is occurred by the output impedance monitor 1300.

Figure 5A:
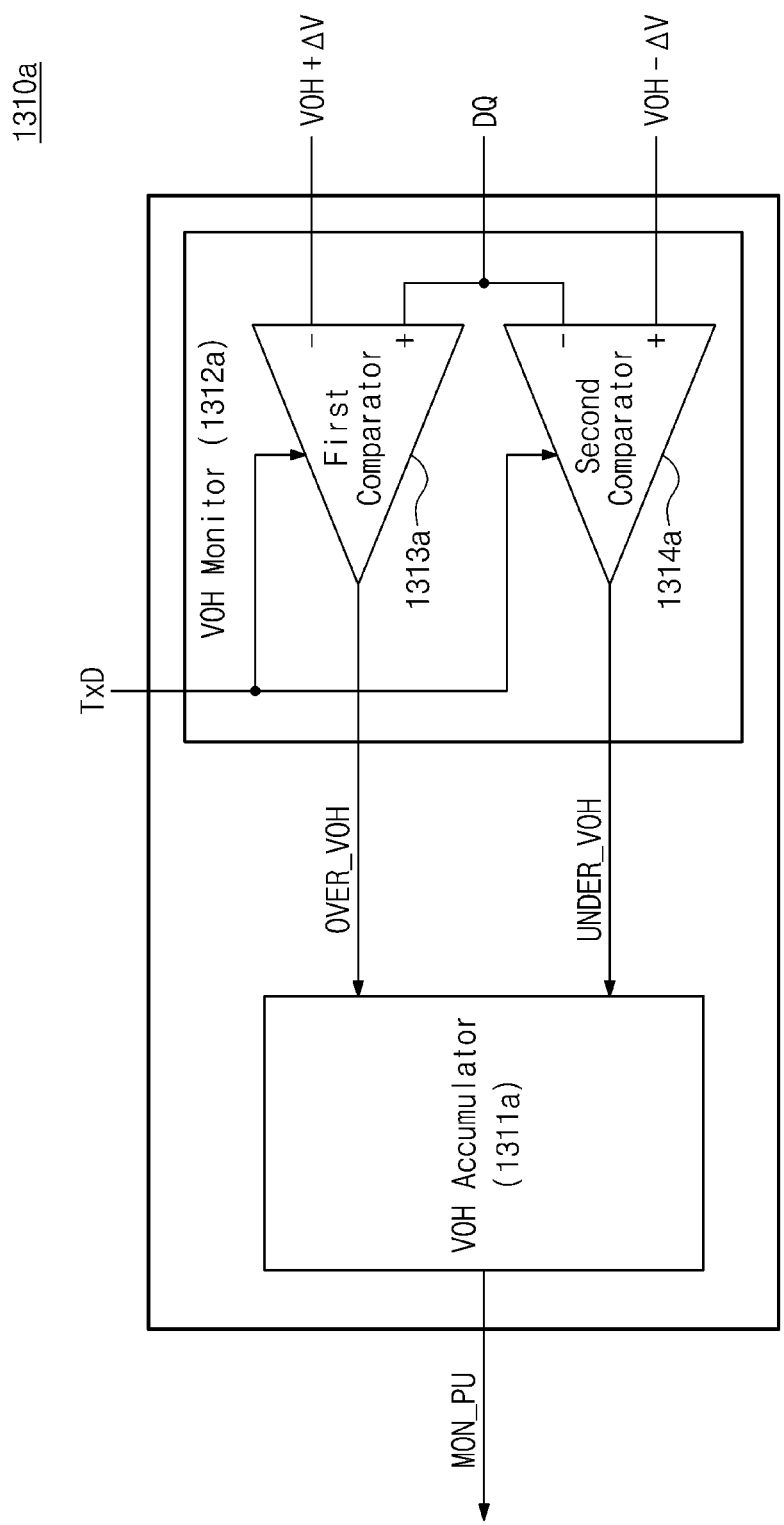
FIG. 5A is a block diagram illustrating a configuration of a pull-up monitor illustrated in FIG. 3.

FIG. 5A is a block diagram illustrating a configuration of the pull-up monitor 1310a illustrated in FIG. 3.

Hereinafter, FIG. 5A will be described with reference to FIGS. 1, 2, 3, and 4B together. The pull-up monitor 1310a may include a VOH accumulator 1311a and a VOH monitor 1312a. The VOH monitor 1312a may include a first comparator 1313a and a second comparator 1314a. When the digital transmission signal TxD received from the control circuit 1100 is the logic high signal, the first comparator 1313a and the second comparator 1314a of the VOH monitor 1312a may be activated.

The first comparator 1313a may compare the level of the output signal DQ of the driving circuit 1200 with the VOH+$\Delta$V value. When the difference between the level of the output signal DQ when outputting logic high and the high voltage signal VOH is greater than a positive allowable range value +$\Delta$V (DQ>VOH+$\Delta$V) as illustrated in the second section T102 of FIG. 4B, the output impedance monitor 1300 may determine that the change in which the output impedance of the pull-up driver 1201_2 is less than a normal value occurs. When it is determined that the change in which the output impedance of the pull-up driver 1201_2 is less than the normal value occurs, the first comparator 1313*a* may output a high voltage over signal OVER_VOH as the logic high signal.

The second comparator 1314*a* may compare the level of the output signal DQ of the driving circuit 1200 with the VOH−ΔV value. When the difference between the level of the output signal DQ when outputting logic high and the high voltage signal VOH is greater than a negative allowable range value −ΔV (DQ<VOH−ΔV) as illustrated in the third section T103 of FIG. 4B, the output impedance monitor 1300 may determine that the change in which the output impedance of the pull-up driver 1201_2 is greater than the normal value occurs. When it is determined that the change in which the output impedance of the pull-up driver 1201_2 is greater than the normal value occurs, the second comparator 1314*a* may output a high voltage under signal UNDER_VOH as the logic high signal.

The high voltage over signal OVER_VOH output by the first comparator 1313*a* or the high voltage under signal UNDER_VOH output by the second comparator 1314*a* may be output to the VOH accumulator 1311*a*. The VOH accumulator 1311*a* may accumulate the input high voltage over signal OVER_VOH or the input high voltage under signal UNDER_VOH. For example, the VOH accumulator 1311*a* may be an integrator, a digital filter, a digital counter, or a sigma-delta modulator, but the inventive concept is not limited thereto.

For example, when the change in which the output impedance of the pull-up driver 1201_2 is less than the normal value continuously occurs, the high voltage over signal OVER_VOH output as the logic high signal may be accumulated. For example, when the change in which the output impedance of the pull-up driver 1201_2 is greater than the normal value continuously occurs, the high voltage under signal UNDER_VOH output as the logic high signal may be accumulated. The VOH accumulator 1311*a* may calculate an average value by accumulating the values of the high voltage over signal OVER_VOH or the high voltage under signal UNDER_VOH, and the VOH accumulator 1311*a* may output the pull-up monitoring signal MON_PU, based on the average value.

When the VOH accumulator 1311*a* outputs the pull-up monitoring signal MON_PU, the output impedance calibrator 1400 may receive the pull-up monitoring signal MON_PU.

As described above, the VOH accumulator 1311*a* outputs the pull-up monitoring signal MON_PU only when the high voltage over signal OVER_VOH or the high voltage under signal UNDER_VOH is accumulated over a preset threshold value. Accordingly, when the output of the first comparator 1313*a* or the second comparator 1314*a* is incorrect due to noise, etc., it is possible to prevent the output impedance of the driving circuit 1200 from being incorrectly calibrated.

Figure 5B:
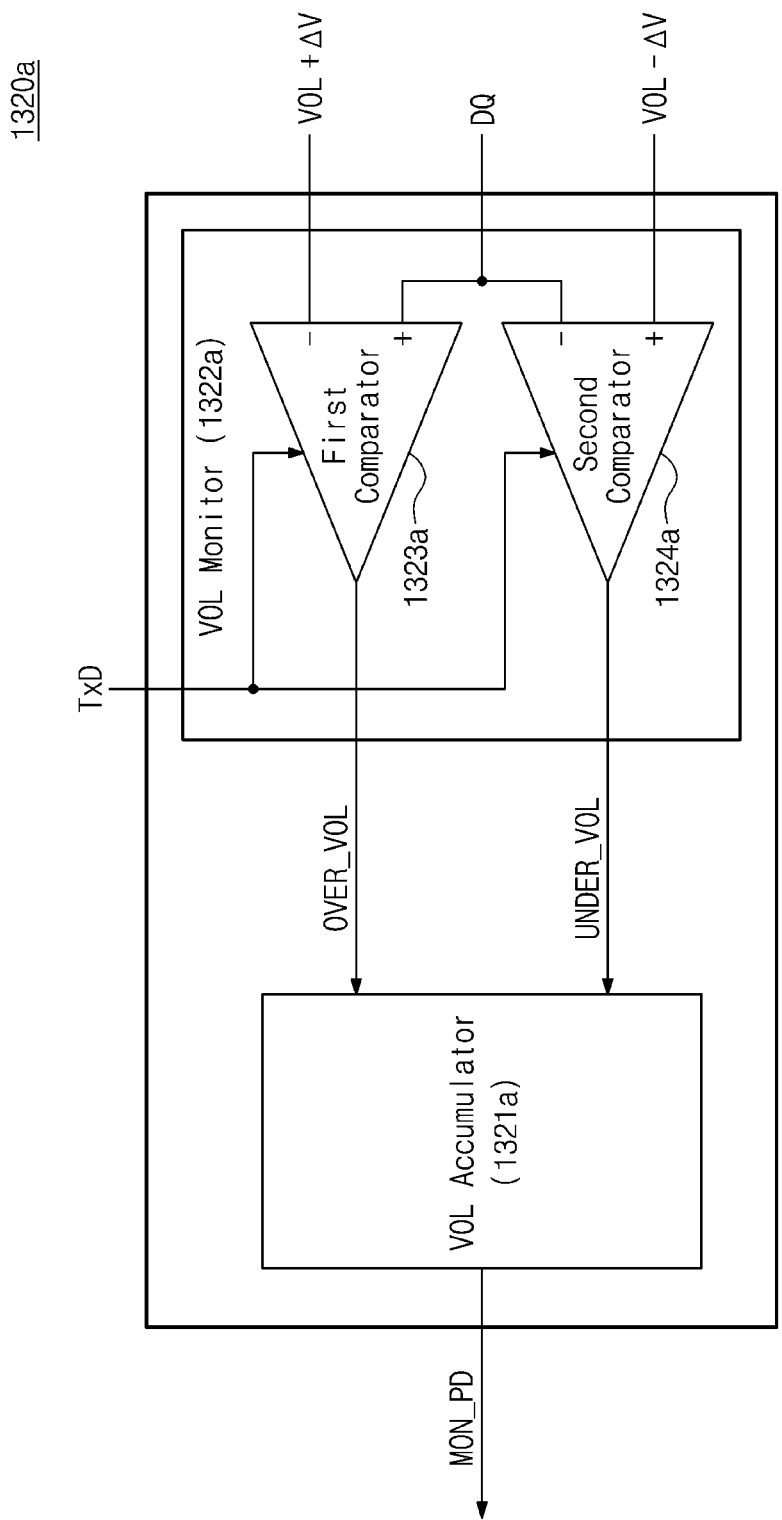
FIG. 5B is a block diagram illustrating a configuration of a pull-down monitor illustrated in FIG. 3.

FIG. 5B is a block diagram illustrating a configuration of the pull-down monitor 1320*a* illustrated in FIG. 3.

Hereinafter, FIG. 5B will be described with reference to FIGS. 1, 2, 3, and 4B together. The pull-down monitor 1320*a* may include a VOL accumulator 1321*a* and a VOL monitor 1322*a*. The VOL monitor 1322*a* may include a first comparator 1323*a* and a second comparator 1324*a*. When the digital transmission signal TxD received from the control circuit 1100 is the logic low signal, the first comparator 1323*a* and the second comparator 1324*a* of the VOL monitor 1322*a* may be activated.

The first comparator 1323*a* may compare the level of the output signal DQ of the driving circuit 1200 with the VOL+ΔV value. When the difference between the level of the output signal DQ when outputting logic low and the low voltage signal VOL is greater than the positive allowable range value +ΔV (DQ>VOL+ΔV) as illustrated in the fifth section T105 of FIG. 4B, the output impedance monitor 1300 may determine that the change in which the output impedance of the pull-down driver 1201_3 is greater than the normal value occurs. When it is determined that the change in which the output impedance of the pull-down driver 1201_3 is greater than the normal value occurs, the first comparator 1323*a* may output a low voltage over signal OVER_VOL as the logic high signal.

The second comparator 1324*a* may compare the level of the output signal DQ of the driving circuit 1200 with the VOL−ΔV value. When the difference between the level of the output signal DQ when outputting logic low and the low voltage signal VOL is greater than the negative allowable range value −ΔV (DQ<VOL−ΔV) as illustrated in the fourth section T104 of FIG. 4B, the output impedance monitor 1300 may determine that the change in which the output impedance of the pull-down driver 1201_3 is less than the normal value occurs. When it is determined that the change in which the output impedance of the pull-up driver 1201_2 is less than the normal value occurs, the second comparator 1324*a* may output a low voltage under signal UNDER_VOL as the logic high signal.

A process in which the low voltage over signal OVER_VOL or the low voltage under signal UNDER_VOL output from the first comparator 1323*a* or the second comparator 1324*a* is accumulated in the VOL accumulator 1321*a*, and the pull-down monitoring signal MON_PD is output to the output impedance calibrator 1400 is the same as described with reference to FIG. 5A.

The output impedance calibrator 1400 may output the impedance monitoring signal MON_ZQ that may determine the number of transistors to be turned on or off among the PMOS transistors constituting the pull-up driver 1201_2 or the NMOS transistors constituting the pull-down driver 1201_3 to calibrate the output impedance of the driving circuit 1200.

The output impedance calibrator 1400 may include a memory (not illustrated). The memory may include a table (not illustrated) that represents a correspondence relationship between the pull-up monitoring signal MON_PU received from the VOH accumulator 1311*a* and the number of PMOS transistors to be turned on or off in the pull-up driver 1201_2 to calibrate the output impedance of the driving circuit 1200, and a correspondence relationship between the pull-down monitoring signal MON_PD received from the VOL accumulator 1321*a* and the number of NMOS transistors to be turned on or off in the down driver 1201_3 to calibrate the output impedance of the driving circuit 1200.

The table may receive the pull-up monitoring signal MON_PU or the pull-down monitoring signal MON_PD, and may output the impedance monitoring signal MON_ZQ corresponding to the pull-up monitoring signal MON_PU or the pull-down monitoring signal MON_PD. The pre-driver 1201_1 of the driving circuit 1200 may receive the impedance monitoring signal MON_ZQ, and may output the pull-up driving signal DRV_PU or the pull-down driving signal DRV_PD corresponding to the impedance monitoring signal MON_ZQ.

Figure 6:
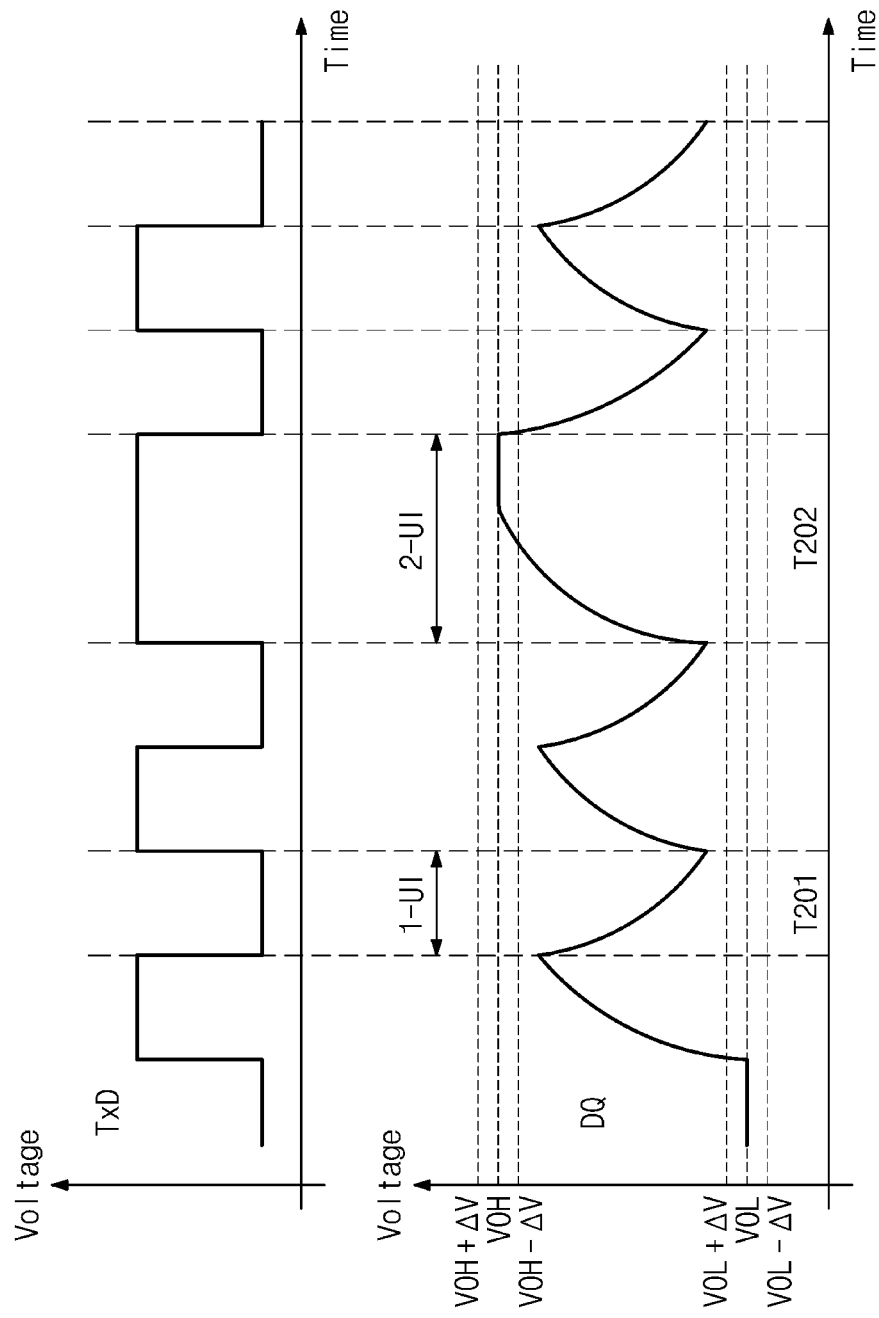
FIG. 6 is a diagram illustrating a waveform of an output signal according to a change in an output impedance of a driving circuit according to another embodiment of the inventive concept.

FIG. 6 illustrates a waveform of an output signal according to a change in an output impedance of the driving circuit 1200 according to another embodiment of the inventive concept.

Referring to FIG. 6 with reference to FIG. 1, a time taken for 1-bit data to be transmitted from the driving circuit 1200 may be defined as a unit interval (UI). When the level of the output signal DQ transitions from logic low to logic high, or the level of the output signal DQ transitions from logic high to logic low, a transition may not be completed within 1 UI and the normal state may not be reached.

In the case of a first section T201, the level of the output signal DQ within 1 UI indicates that the transition from logic low to logic high is not completed and the normal state is not reached. In the case of a second section T202, the level of the output signal DQ during 2 UI indicates that the transition from logic low to logic high is completed and the normal state is reached.

In a case in which the transition is not completed within 1 UI as in the first section T201, when the method of determining the occurrence of the change in the output impedance described above with reference to FIGS. 4A to 4B is applied, even though the output signal DQ is not reached to the normal state, the output impedance monitor 1300 may incorrectly determine that the change in the output impedance occurs in the driving circuit 1200. When the output signal DQ is not reached the normal state within 1 UI, a method of determining the occurrence of the output impedance change by the output impedance monitor 1300 will be described through FIGS. 7A to 7B.

Figure 7A:
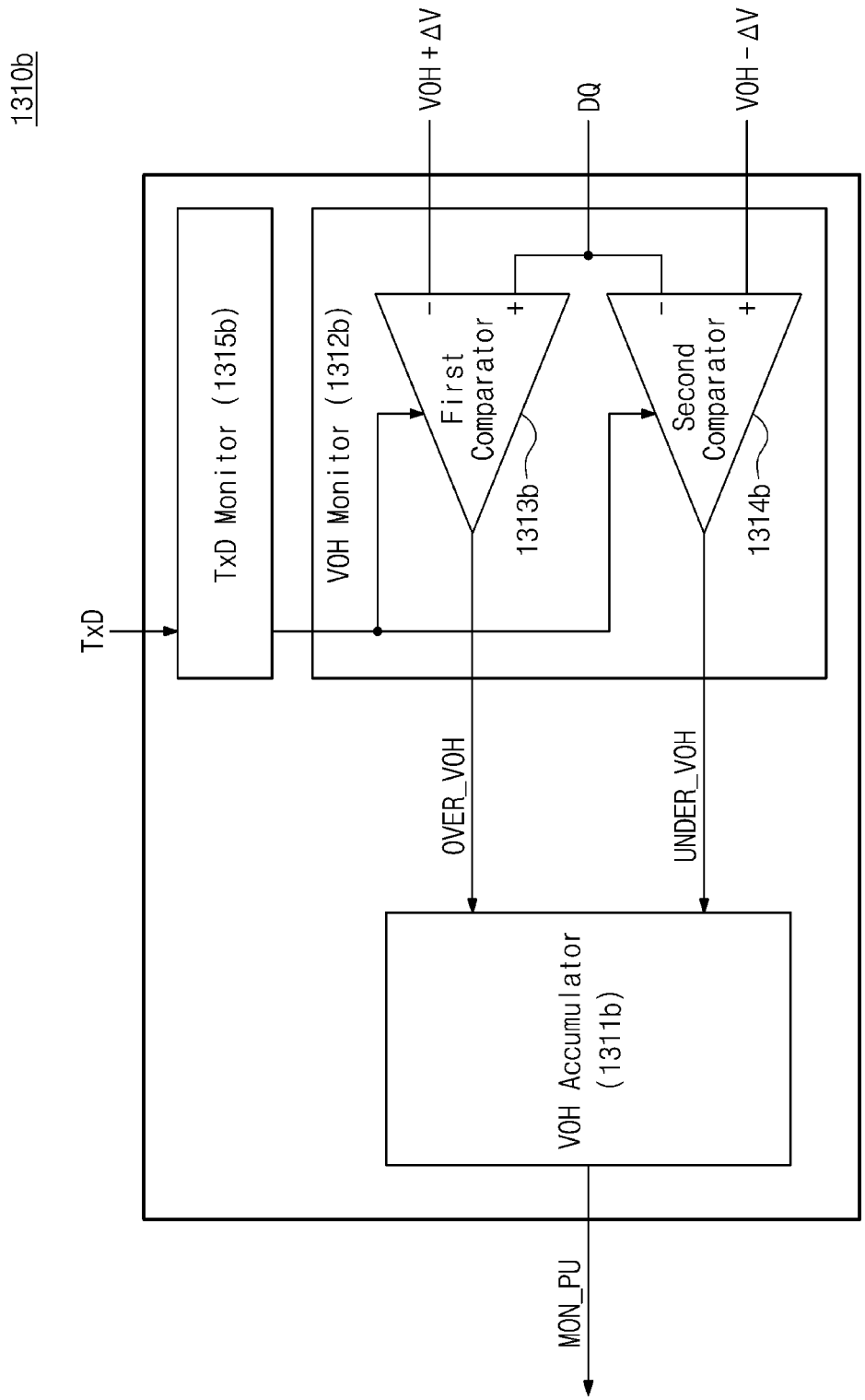
FIG. 7A is a block diagram illustrating a configuration of a pull-up monitor according to another embodiment of the inventive concept.

FIG. 7A is a block diagram illustrating a configuration of a pull-up monitor 1310b according to another embodiment of the inventive concept.

Hereinafter, FIG. 7A will be described with reference to FIGS. 1 and 6 together. The pull-up monitor 1310b may include a VOH accumulator 1311b, a VOH monitor 1312b, and a TxD monitor 1315b. The VOH monitor 1312b may include a first comparator 1313b and a second comparator 1314b. The TxD monitor 1315b may determine whether the digital transmission signal TxD is continuously received for a preset time.

For example, when the output signal DQ of the driving circuit 1200 takes time of 2 UI to reach the normal state, the TxD monitor 1315b may determine whether the digital transmission signal TxD is input repeatedly during 2 UI. When the time of 2 UI is required for the output signal DQ to reach the normal state, the TxD monitor 1315b repeatedly may receive the digital transmission signal TxD for the time of 2 UI, and the first comparator 1313b and the second comparator 1314b may be activated when the digital transmission signal TxD is the logic high signal. However, the inventive concept is not limited to the case where it takes 2 UI time for the output signal DQ to reach the normal state.

Figure 7B:
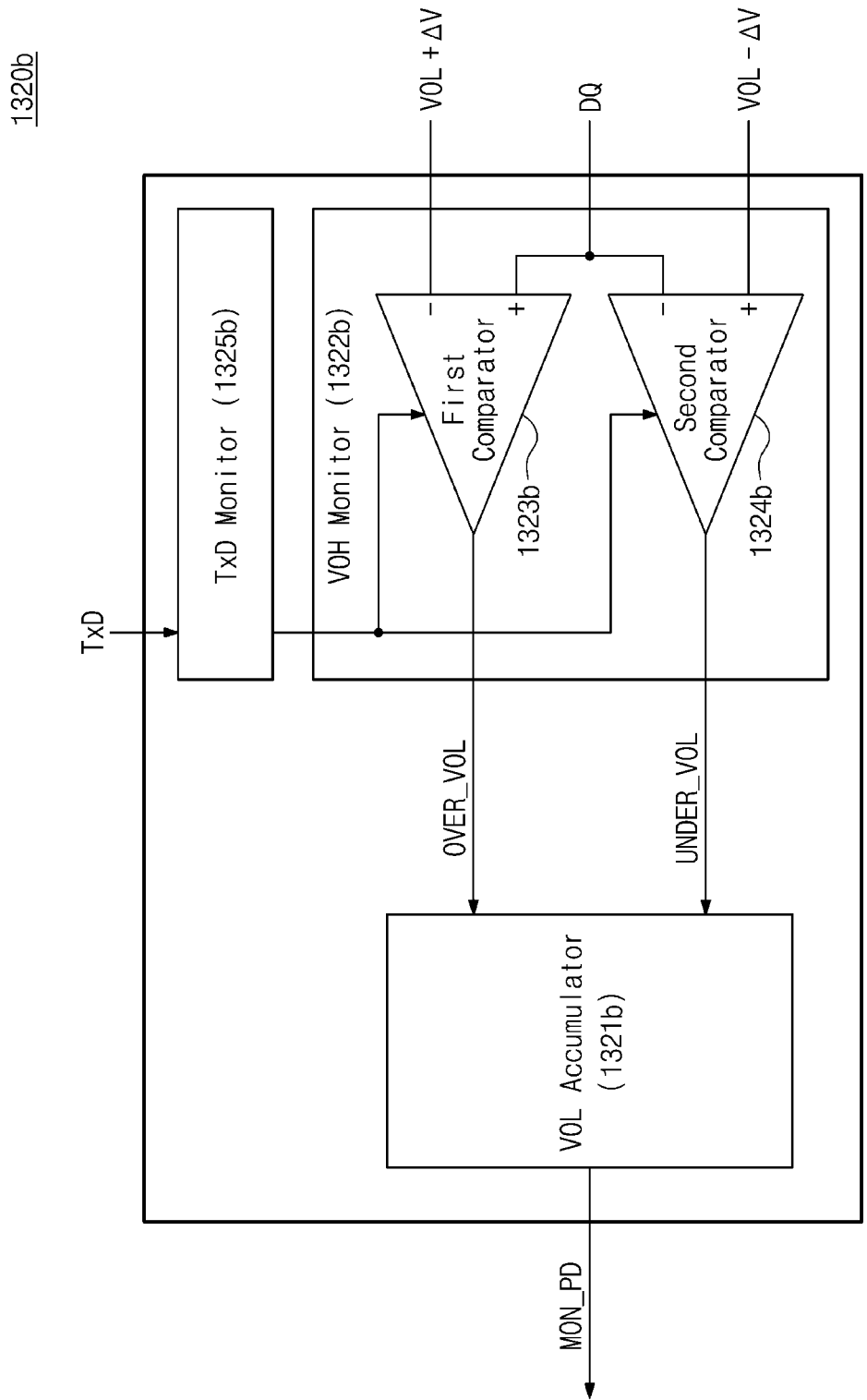
FIG. 7B is a block diagram illustrating a configuration of a pull-down monitor according to another embodiment of the inventive concept.

An operation of the first comparator 1313b, the second comparator 1314b, and the VOH accumulator 1311b and the driving circuit 1200 after the first comparator 1313b and the second comparator 1314b are activated, and a process of calibrating the output impedance of the driving circuit 1200 are the same as described with reference to FIG. 5A FIG. 7B is a block diagram illustrating a configuration of a pull-down monitor 1320b according to another embodiment of the inventive concept. An operation of the pull-down monitor 1320b is the same as described with reference to FIGS. 5B and 7A.

Figure 8:
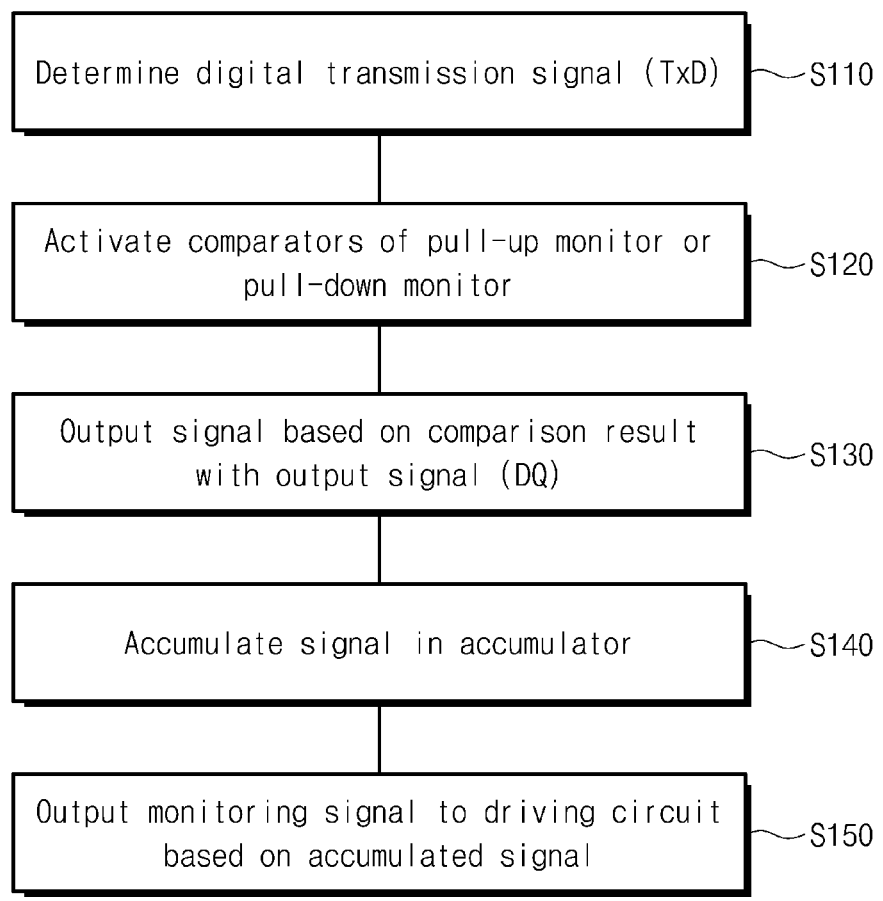
FIG. 8 is a flowchart illustrating an operation of a memory interface circuit according to an embodiment of the inventive concept.

FIG. 8 is a flowchart illustrating an operation of a memory interface circuit according to an embodiment of the inventive concept. Hereinafter, FIG. 8 will be described with reference to FIGS. 2, 5A, and 5B together.

In operation S110, the output impedance monitor 1300 may determine whether the input digital transmission signal TxD is the logic high signal or the logic low signal. When it is determined that the digital transmission signal TxD is the logic high signal, the first comparator 1313a and the second comparator 1314a of the pull-up monitor 1310a may be activated in operation S120. When it is determined that the digital transmission signal TxD is the logic low signal, the first comparator 1323a and the second comparator 1324a of the pull-down monitor 1320a may be activated in operation S120.

When the first comparator 1313a and the second comparator 1314a of the pull-up monitor 1310a are activated in operation S120, in operation S130, the first comparator 1313a may compare the level of the output signal DQ with the VOH+ΔV value and may output the high voltage over signal OVER_VOH as the logic high signal, and the second comparator 1314a may compare the level of the output signal DQ with the VOH−ΔV value and may output the high voltage under signal UNDER_VOH as the logic high signal.

When the first comparator 1323a and the second comparator 1324a of the pull-down monitor 1320a are activated, in operation S130, the first comparator 1323a may compare the level of the output signal DQ with the VOL+ΔV value and may output the low voltage over signal OVER_VOL as the logic high signal, and the second comparator 1324a may compare the level of the output signal DQ and the VOL−ΔV value and may output the low voltage under signal UNDER_VOL as the logic high signal.

In operation S140, the VOH accumulator 1311a may receive and accumulate the high voltage over signal OVER_VOH or the high voltage under signal UNDER_VOH. In operation S140, the VOL accumulator 1321a may receive and accumulate the low voltage over signal OVER_VOL or the low voltage under signal UNDER_VOL.

In operation S150, when the high voltage over signal OVER_VOH or the high voltage under signal UNDER_VOH is accumulated over the preset threshold value, the VOH accumulator 1311a may output the pull-up monitoring signal MON_PU to the output impedance calibrator 1400, and the output impedance calibrator 1400 may output the impedance monitoring signal MON_ZQ corresponding to the pull-up monitoring signal MON_PU to the driving circuit 1200.

When the low voltage over signal OVER VOL or the low voltage under signal UNDER_VOL is accumulated over the preset threshold value, the VOL accumulator 1321a may output the pull-down monitoring signal MON_PD to the output impedance calibrator 1400, and the output impedance calibrator 1400 may output the impedance monitoring signal MON_ZQ corresponding to the pull-down monitoring signal MON_PD to the driving circuit 1200.

The pre-driver 1201_1 of the driving circuit 1200 may output the pull-up driving signal DRV_PU or the pull-down driving signal DRV_PD corresponding to the input impedance monitoring signal MON_ZQ.

According to the inventive concept, a change in an output impedance of a memory interface circuit may be monitored in real time, and the output impedance may be calibrated without interrupting data transmission by applying the result.

Furthermore, according to the inventive concept, a memory interface circuit including an output impedance monitor, which increases data transmission efficiency per unit time, and a method for calibrating the output impedance thereof may be implemented.

The contents described above are specific embodiments for implementing the inventive concept. The inventive concept will include not only the embodiments described above but also embodiments in which a design is simply or easily capable of being changed. In addition, the inventive concept may also include technologies easily changed to be implemented using embodiments. Therefore, the scope of the inventive concept is not limited to the described embodiments but should be defined by the claims and their equivalents.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A memory interface circuit comprising:
a control circuit configured to output a digital transmission signal;
a driving circuit configured to output an output signal, based on the digital transmission signal;
an output impedance monitor configured to output a pull-up monitoring signal or a pull-down monitoring signal, based on the digital transmission signal and the output signal; and
an output impedance calibrator configured to output an impedance monitoring signal, based on the pull-up monitoring signal or the pull-down monitoring signal, wherein
the driving circuit calibrates output impedance based on the impedance monitoring signal,
the output impedance monitor includes a pull-up monitor and a pull-down monitor,
the pull-up monitor includes a VOH accumulator and a VOH monitor,
the pull-down monitor includes a VOL accumulator VOL monitor
the VOH monitor and the VOL monitor receive the digital transmission signal,
when the received digital transmission signal is a logic high signal, the first comparator and the second comparator of the VOH monitor are activated,
when the received digital transmission signal is a logic low signal, the first comparator and the second comparator of the VOL monitor are activated, and
the pull-up monitor and the pull-down monitor include a TxD monitor that determines whether a duration for which the digital transmission signal is maintained as he logic high signal or the logic low signal is greater than or equal to a threshold time.

2. The memory interface circuit of claim 1, wherein the driving circuit includes a plurality of drivers connected in parallel; and
wherein the plurality of drivers include a pre-driver, a pull-up driver, and a pull-down driver, and
wherein the pull-up driver includes a plurality of sub pull-up drivers connected in parallel, and the pull-down driver includes a plurality of sub pull-down drivers connected in parallel;
wherein, when the digital transmission signal is a logic high signal, the pre-driver outputs a pull-up driving signal to the pull-up driver, and the pull-up driver is activated in response to the pull-up driving signal;
wherein, when the digital transmission signal is a logic low signal, the pre-driver outputs a pull-down driving signal to the pull-down driver, and the pull-down driver is activated in response to the pull-down driving signal; and
wherein the pre-driver outputs the pull-up driving signal or the pull-down driving signal corresponding to the impedance monitoring signal.

3. The memory interface circuit of claim 1, wherein the VOH monitor and the VOL monitor include a first comparator and a second comparator.

4. The memory interface circuit of claim 3, wherein the first comparator of the VOH monitor compares a level of the output signal when outputting logic high with a first high voltage signal and outputs a high voltage over signal;
wherein the second comparator of the VOH monitor compares a level of the output signal when outputting logic high with a second high voltage signal and outputs a high voltage under signal;
wherein the first comparator of the VOL monitor compares a level of the output signal when outputting logic low with a first low voltage signal and outputs a low voltage over signal; and
wherein the second comparator of the VOL monitor compares a level of the output signal when outputting logic low with a second low voltage signal and outputs a low voltage under signal.

5. The memory interface circuit of claim 4, wherein a value of the first high voltage signal is a value increased by an allowable range value with respect to a value of a high voltage signal indicating logic high;
wherein a value of the second high voltage signal is a value decreased by the allowable range value with respect to the value of the high voltage signal;
wherein a value of the first low voltage signal is a value increased by the allowable range value with respect to a value of a low voltage signal indicating logic low; and
wherein a value of the second low voltage signal is a value decreased by the allowable range value with respect to the value of the low voltage signal.

6. The memory interface circuit of claim 5, wherein the VOH accumulator:
accumulates the high voltage over signal or the high voltage under signal; and
outputs the pull-up monitoring signal, based on the accumulated high voltage over signal or the accumulated high voltage under signal, and
wherein the VOL accumulator:
accumulates the low voltage over signal or the low voltage under signal; and
outputs the pull-down monitoring signal, based on the accumulated low voltage over signal or the accumulated low voltage under signal.

7. The memory interface circuit of claim 3,
wherein the VOH monitor and the VOL monitor receive the digital transmission signal only when it is determined that the duration is greater than or equal to the threshold time; and
wherein the threshold time is determined as a multiple of a time required for 1-bit data to be transmitted by the driving circuit.

8. A method of calibrating an output impedance of a memory interface circuit, the method comprising:
outputting, by a control circuit, a digital transmission signal;
outputting, by a driving circuit, an output signal based on the digital transmission signal;
outputting, by a pull-up monitor or a pull-down monitor of an output impedance monitor, a monitoring signal based on the digital transmission signal and the output signal;

outputting, by an output impedance calibrator, an impedance monitoring signal based on the monitoring signal; and calibrating, by the driving circuit, an output impedance based on the impedance monitoring signal, wherein when the digital transmission signal is a logic high signal, the outputting of the monitoring signal includes:

activating a first comparator and a second comparator in a VOH monitor of the pull-up monitor:

outputting a high voltage over signal by comparing a level of the output signal with a first high voltage signal in the first comparator or the VOH monitor; and outputting a high voltage under signal by comparing the level of the output signal with a second high voltage signal in the second comparator of the VOH monitor.

9. The method of claim 8, wherein a value of the first high voltage signal is a value increased by an allowable range value with respect to a value of a high voltage signal indicating logic high; and wherein a value of the second high voltage signal is a value decreased by the allowable range value with respect to the value of the high voltage signal.

10. The method of claim 9, wherein the outputting of the monitoring signal further includes:

accumulating, by a VOH accumulator of the pull-up monitor, the high voltage over signal or the high voltage under signal; and outputting, by the VOH accumulator of the pull-up monitor, a pull-up monitoring signal, based on the accumulated high voltage over signal or the accumulated high voltage under signal.

11. The method of claim 10, wherein the outputting of the impedance monitoring signal further includes:

outputting, by pre-driver of the driving circuit, a pull-up driving signal corresponding to the impedance monitoring signal output based on the pull-up monitoring signal.

12. The method of claim 9, wherein the outputting of the monitoring signal further includes:

determining, by a TxD monitor of the pull-up monitor, whether a duration for which the digital transmission signal is maintained as the logic high signal is greater than or equal to a threshold time; and receiving, by the VOH monitor, the digital transmission signal only when the duration is greater than or equal to the threshold time, and wherein the threshold time is determined as a multiple of a time required for 1-bit data to be transmitted by the driving circuit.

13. The method of claim 8, wherein, when the digital transmission signal is a logic low signal, the outputting of the monitoring signal includes:

activating a first comparator and a second comparator in a VOL monitor of the pull-down monitor;

outputting a low voltage over signal by comparing a level of the output signal with a first low voltage signal in the first comparator of the VOL monitor; and outputting a low voltage under signal by comparing the level of the output signal with a second low voltage signal in the second comparator of the VOL monitor, and wherein a value of the first low voltage signal is a value increased by an allowable range value with respect to a value of a low voltage signal indicating logic low; and wherein a value of the second low voltage signal is a value decreased by the allowable range value with respect to the value of the low voltage signal.

14. The method of claim 13, wherein the outputting of the monitoring signal further includes:

accumulating, by a VOL accumulator of the pull-down monitor, the low voltage over signal or the low voltage under signal; and outputting, by the VOL accumulator of the pull-down monitor, a pull-down monitoring signal, based on the accumulated low voltage over signal or the accumulated low voltage under signal.

15. The method of claim 14, wherein the outputting of the impedance monitoring signal further includes:

outputting, by pre-driver of the driving circuit, a pull-down driving signal corresponding to the impedance monitoring signal output based on the pull-down monitoring signal.

16. The method of claim 13, wherein the outputting of the monitoring signal further includes:

determining, by a TxD monitor of the pull-down monitor, whether a duration for which the digital transmission signal is maintained as the logic high signal is greater than or equal to a threshold time; and receiving, by the VOL monitor, the digital transmission signal only when the duration is greater than or equal to the threshold time, and wherein the threshold time is determined as a multiple of a time required for 1-bit data to be transmitted by the driving circuit.

* * * * *